United States Patent [19]

Savarese

[11] 4,037,217

[45] July 19, 1977

[54] READ-ONLY MEMORY USING COMPLEMENTARY CONDUCTIVITY TYPE INSULATED GATE FIELD EFFECT TRANSISTORS

[75] Inventor: Giuseppe Savarese, Antibes, France

[73] Assignee: Texas Instruments Incorporated, Dallas, Tex.

[21] Appl. No.: 612,968

[22] Filed: Sept. 12, 1975

[30] Foreign Application Priority Data

Sept. 19, 1974 France .................................. 74.31620

[51] Int. Cl.² .................... G11C 17/00; G11C 11/40
[52] U.S. Cl. .............................. 340/173 SP; 307/238; 340/173 R; 357/45
[58] Field of Search ...... 340/173 R, 173 CA, 173 SP; 307/238; 357/45, 24

[56] References Cited

U.S. PATENT DOCUMENTS

| 3,728,696 | 4/1973 | Polkinghorn | 340/173 SP |
| 3,760,380 | 9/1973 | Hoffman et al. | 340/173 R |
| 3,866,186 | 2/1975 | Suzuki | 340/173 SP |

Primary Examiner—David L. Trafton
Attorney, Agent, or Firm—Harold Levine; Richard L. Donaldson; James T. Comfort

[57] ABSTRACT

A read-only memory, comprising a decoder and a storage memory, wherein the decoder matrix and the storage memory matrix each comprises complementary metal oxide semiconductor transistors. Each column of the decoder matrix and each column of the storage memory matrix is connected to a single load or precharge transistor.

7 Claims, 1 Drawing Figure

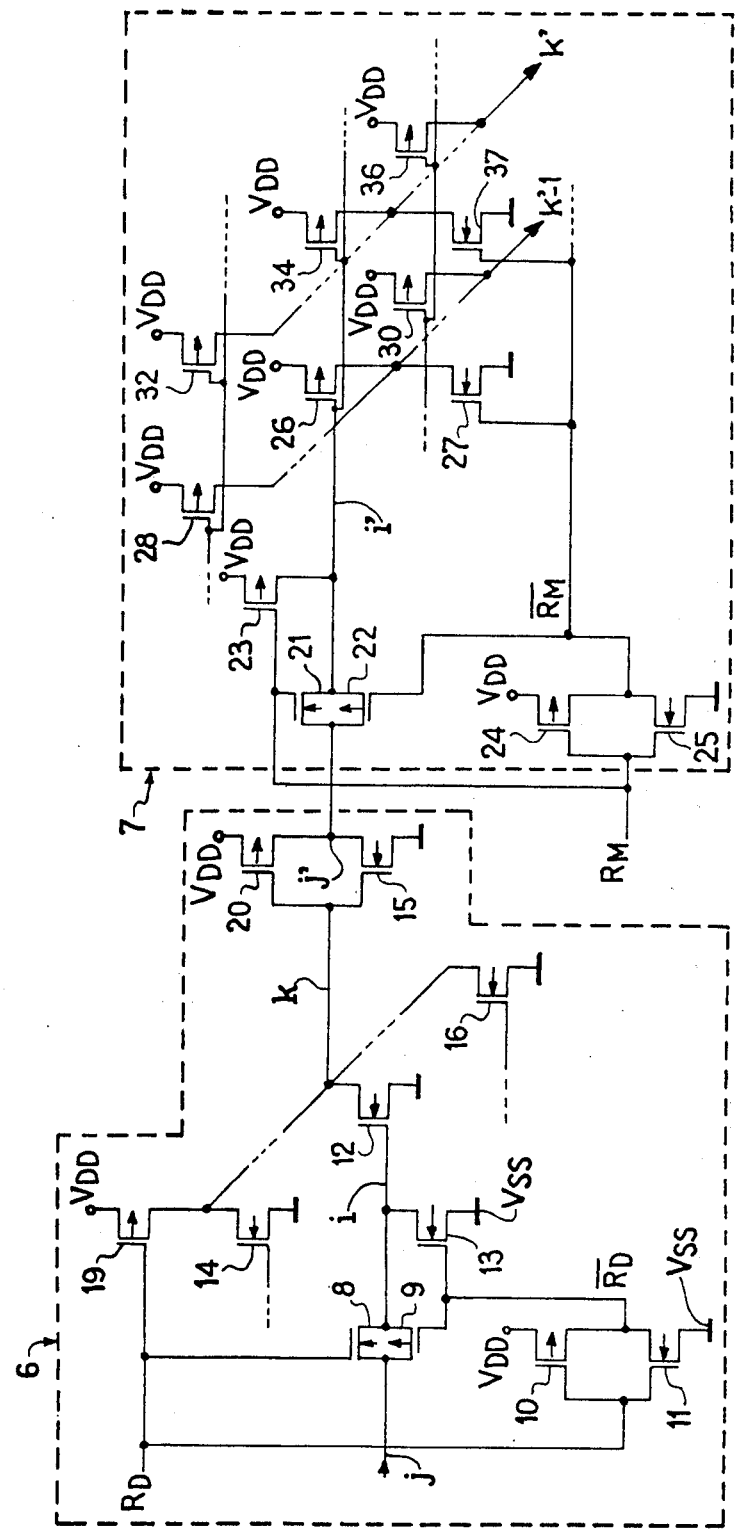

READ-ONLY MEMORY USING COMPLEMENTARY CONDUCTIVITY TYPE INSULATED GATE FIELD EFFECT TRANSISTORS

The present invention relates to a read-only memory, and concerns more particularly a read-only memory with complementary metal oxide semiconductor components.

A typical read-only memory circuit is composed mainly of a decoder and a storage memory. The binary address associated with the word chosen in the memory is applied to the decoder only one line of which is rendered active, permitting the reading of the word considered. When this line is rendered active, the output of each of the columns of the storage memory is "0" or "1", according to the presence or absence of a metal oxide semiconductor or MOS transistor at the intersection of the column considered with the chosen line. The decoder and the storage memory are composed of NOR multiple input gate networks. The number of these inputs increases rapidly with the capacity of the read-only memory. The structure of a read-only memory is therefore linked to that of the NOR gates composing it.

Read-only memories have been realized comprising NOR gates composed exclusively of p-channel MOS transistors. A NOR gate of this type comprises a charging transistor and a driving transistor for each input, all driving transistors being connected in parallel.

A NOR gate constructed with complementary MOS components requires, for each input, a p-channel series transistor and an n-channel parallel transistor, so that a NOR gate with complementary MOS components comprising for example 32 inputs must have 32 p-channel series transistors, and 32 n-channel parallel transistors.

The NOR gate with complementary MOS components presents two major disadvantages:

1. Its propagation time is disadvantageously long because the capacitance at the output of the gate must be charged by as many p-channel transistors in series as the gate has inputs, the number of these transistors increasing with the capacity of the memory.

2. It is theoretically ill suited to constitute a memory because a memory with complementary MOS components is composed of a double matrix (one for the p-channel, one for the n-channel), resulting in considerable increase in semiconductor surface area required for any given memory capacity.

The invention aims to remedy the above stated disadvantages by creating a read-only memory of complementary MOS components, of small space requirement, and presenting a rapid access time.

According to the invention, a read-only memory of insulated gate field effect transistors comprising a decoder and a storage memory, is characterized in that the decoder and the storage memory are realized by means of complementary conductivity type insulated gate field effect transistors.

In a particular embodiment of the invention, the decoder matrix and the storage memory matrix each includes a single output (precharge) transistor for each column. Each address input of the decoder matrix has an associated "killer" transistor, as does each row of the storage memory matrix. In a standby condition, an interrogation signal (logic level 0) is applied to the decoder, turning on all the killer transistors as well as the precharge transistors of the decoder, causing all the decoder outputs to be precharged at a logic 1 level. In a standby condition of the memory matrix, an interrogation signal (logic level 0) is applied thereto causing all the killer transistors and precharge transistors of the memory matrix to turn on at a standby logic level 0 output from all of the matrix columns.

When the address inputs to the decoder are stable, the decoder interrogation signal is switched to a logic level 1, and the killer transistors and precharge transistors turn off. The address inputs are entered, resulting in only one decoder output being at a logic 1 level, dependent on the address input code. The decoder outputs are inverted and applied to the storage memory matrix. Then the storage matrix interrogation signal is switched to a logic 1 level. This turns the storage matrix killer transistors and precharge transistors OFF. The decoder outputs (row signals) are then entered into the storage matrix and, if a transistor is connected at the intersection of the selected row and column of the storage matrix, that node will be charged from a precharged logic level 0 to a logic level 1.

By way of example, and for a more detailed understanding of the invention and additional advantageous characteristics thereof, an embodiment will be described in greater detail with reference to the sole FIGURE of drawing showing a circuit diagram of a read-only semiconductor memory.

The complementary MOS transistor read-only memory shown in this FIGURE has a decoder 6 and a storage memory 7, represented by the rectangles in broken lines.

The decoder 6 comprises, for each of a multiplicity of columns of which only column $k$ is shown, a series of address inputs, only the input $j$ being shown. The input $j$ is connected to a transfer gate formed by an n-channel MOS transistor 8 and a p-channel MOS transistor 9.

The gate of transistor 8 is connected to the interrogation input $R_D$ of the decoder, while the gate of transistor 9 is connected to this same input through an inverter formed by a p-channel MOS transistor 10 and an n-channel MOS transistor 11, connected in series between supply voltages $V_{DD}$ and $V_{SS}$, respectively, the gates of these transistors being commonly connected to the input $R_D$. The drains of the transistors 8 and 9 are commonly connected to the gate of an n-channel MOS transistor 12.

The gate of transistor 9 is also connected to the gate of an n-channel MOS transistor 13 (killer transistor) whose source-drain path is connected between the gate of transistor 12 and ground or voltage supply $V_{SS}$.

The transistor 12 forms part of a row i of the matrix of decoder 6 which includes a multiplicity of identical rows, two more of which are represented in the FIGURE by the broken lines connected to the gates of the n-channel MOS transistors 14 and 16. The group of transistors including transistors 12, 14 and 16 constitutes the column $k$ of the decoder matrix. Their drains are connected to a p-channel MOS transistor 19 whose source is connected to the supply voltage $V_{DD}$ and whose gate is connected to the interrogation input $R_D$ of the decoder. Column $k$ of the decoder matrix further includes an inverter formed by a p-channel MOS transistor 20 and an n-channel transistor 15 whose gates are connected to the column $k$; the drains jointly constitute an output $j'$ of the decoder corresponding to the drain of transistor 20, whose source is connected to the supply voltage $V_{DD}$, and to the drain of transistor 15, whose source is connected to the supply voltage $V_{SS}$. Other columns of the decoder are constructed in like manner to column k, each column including an individual output inverter.

The storage memory 7 includes a storage matrix having a series of lines and a series of columns, of which only line $i'$ and the columns $k'$-1 and $k'$ are shown.

Line $i'$ of the storage memory comprises a transfer gate formed by an n-channel MOS transistor 21 and a p-channel MOS transistor 22, connected, on one hand, to the output $j'$ of the decoder and, on the other, to the drain of a p-channel MOS transistor 23 whose source is connected to the supply voltage $V_{DD}$.

The gate of transistor 21 is connected to the interrogation input $R_M$ of the memory, while the gate of transistor 22 is connected to this same input through an inverter comprising a p-channel MOS transistor 24 and an n-channel MOS transistor 25, connected in series between the drain supply voltage $V_{DD}$ and ground.

The output of the transfer gate comprising the transistors 21 and 22, and the drain of transistor 23 (killer transistor), are connected to the gate of a p-channel MOS transistor 26 whose source-drain path is connected in series with the source-drain path of an n-channel MOS load transistor 27, between the supply voltage $V_{DD}$ and ground.

The gate of transistor 27 is connected to the output of the inverter 24, 25. Transistor 26 constitutes an element of column $k'$-1 of the matrix of the memory, and its drain is connected to the drains of other transistors in that column, such as transistors 28 and 30, whose gates are connected, by means of transfer gates, to individual inverter outputs from the decoder 6. Each column has an individual load transistor, e.g., in column $k'$-1, the drains of the transistors 26, 28, 30, etc. are connected to load transistor 27 whose gate is connected to the output of inverter 24, 25.

In like manner, column $k'$ of the matrix comprises the p-channel MOS transistors 32, 34 and 36, the gates of these transistors being respectively connected to the gates of the transistors 28, 26 and 30, while their sources are connected to the voltage VDD. The drains of the transistors 32, 34, 36 are connected together and to the source-drain path of an n-channel load transistor 37 whose gate is connected to the output of the inverter 24, 25.

The storage matrix thus includes rows of transistors whose gates are connected in common, such as the row including transistors 28, 32, etc. and that including transistors 26, 34, etc. Although the storage memory transistors have been shown with gates connected at each row-column intersection of the matrix, it will be appreciated that in order to code the matrix, gates of transistors at selected intersections will not be connected to the row conductor, as is well known in the art.

The operation of the read-only memory described with reference to the drawing is as follows.

The signals applied to the inputs $R_D$ and $R_M$ of the circuit are rectangular pulses whose trailing edges are synchronized; but the interrogation signal $R_D$ of the decoder 6 has a duration greater than that of the read signal $R_M$ of the storage memory 7. However, the duration of the signal $R_D$ must not exceed the time generally permissible for dynamic capacitive storage in MOS memories, that is, some tens of microseconds. The signal $R_M$ can readily be generated from the signal $R_D$.

In the following, it is considered that the logic level 0 is given by the voltage $V_{SS}$, while the logic level 1 is given by the voltage $V_{DD}$.

When the memory is quiescent, the signals applied to the inputs $R_D$ of the decoder and $R_M$ of the storage memory are at level 0.

Line $i$ of the decoder is precharged at logic 0 level by transistor 13 being made conductive by the application to its gate of the output logic level 1 from the inverter 10, 11.

The transfer gate 8, 9 is OFF because of the blocking of transistor 8 by the logic level 0 of the signal $R_D$, and of transistor 9 by the logic level 1 delivered by the inverter 10, 11, so that transistor 12 is OFF. Likewise, all other transistors 14, 16, etc. of the decoder 6 are blocked.

Consequently, column k of the decoder is precharged at the logic level 1 by the p-channel transistor 19 made conductive by the logic level 0 applied to its gate. Point $j'$, which constitutes the output of the inverter 20, 15, is therefore at the logic level 0. Since the interrogation input $R_M$ of the storage memory 7 is also at the logic level 0, the transfer gate 21, 22 is OFF and its output $i'$ is maintained at the level 1 by the transistor 23 made conductive by the logic level 0 applied to its gate.

It results therefrom that all the p-channel transistors of the columns of the storage matrix of the memory are blocked due to the fact that their gates are at the level 1, their gates being connected to $V_{DD}$ by transistors such as transistor 23, and all the matrix columns $k'$-1, $k'$, etc., are precharged at logic level 0 by the N-channel transistors such as 27, 37, turned on by the logic 1 output of inverter 24, 25.

When the signal applied at the interrogation input $R_D$ is switched to the logic level 1, the signal applied at the read input $R_M$ being still at the level 0, the input address is entered in the decoder 6.

Transfer gates such as 8, 9 are open and the address bits such as that applied to input $j$ are entered into the decoding matrix. Transistor 13 receives a level 0 on its gate and hence it is blocked.

It results therefrom that only a selected column k of the decoder remains precharged at the level 1, dependent on the particular address inputs, while the other columns are discharged to the level 0 through conductive transistors of the decoding matrix which are associated with the nonselected columns.

Thus, the output point $j'$ of the selected decoder column k is the only one present at the level 0, while the output points $j'$ of other decoder matrix columns are at the level 1.

When the signal applied at the read input $R_M$ of the storage memory 7 is switched to the level 1, the information present at point $j'$ passes into the storage memory matrix through the transfer gate 21, 22 which is now open because of the application of the level 1 at the gate of the n-channel transistor 21, and of the level 0 obtained through the inverter 24, 25 to the gate of the p-channel transistor 22. Simultaneously, the transistor 23 is blocked. The chosen matrix line $i'$ is discharged to the level 0 by the transistors 21 and 15.

All transistors of the storage matrix therefore remain blocked, with the exception of those which are associated with the chosen line $i'$. It results therefrom that column $k'$, for example, is charged at the level 1 or remains discharged at the level 0 according to the connection or lack of connection of a transistor such as transistor 34 at the intersection of the chosen line $i'$ and of the column $k'$, as described above.

A read-only memory with complementary MOS components according to the invention presents the advantage of not requiring a clock. It is, therefore, not a dynamic memory. Furthermore, in the decoder matrix as well as in the storage matrix, only one load transistor per column is required.

To obtain faster p-channel read-only memories presenting a minimal surface, the columns of the memory can be multiplexed without changing its NOR structure. The technique of multiplexing is readily applicable to the complementary MOS read-only memory according to the invention.

What is claimed is:

1. A read-only semiconductor memory comprising insulated gate field effect transistors and including a decoder matrix and a storage memory matrix, wherein said decoder matrix and said storage memory matrix each comprises complementary conductivity type insulated gate field effect transistors;

said decoder matrix including a plurality of intersecting rows and columns with each intersection defined by a single insulated gate field effect transistor said intersection transistors all having the same channel conductivity type, each row of said decoder matrix including a plurality of said first transistors and complementary conductivity type insulated gate field effect transistor gate means connecting the gates of said row transistors to a respectively corresponding address input, means connecting an interrogation input for said decoder matrix directly to the gate of one of the transistors of said transfer gate means and means including a complementary conductivity type insulated gate field effect transistor inverter means for connecting said interrogation inputs to the gate of the other transfer gate transistor; each said row transistor also forming part of a different column of said decoder matrix and including a channel connected in common with the channels of other transistors of said column, said other transistors forming part of the other rows of said decoder matrix; for each column of said decoder matrix a single precharge insulated gate field effect transistor of opposite channel conductivity type from that of said intersection transistors connecting the channels of the transistors of that said column to a d.c. supply line; and means connecting the columns of said decoder matrix to respective rows of said storage memory matrix, said storage memory matrix comprising a plurality of intersecting rows and columns with each intersection defined by a single insulated gate field effect transistor, said storage memory matrix intersection transistors all having the same conductivity type, and for each column of the storage memory matrix a single load transistor of opposite conductivity type from that of said storage memory matrix intersection transistors.

2. A memory according to claim 1, wherein said intersection transistors of said decoder matrix have a channel conductivity type opposite from that of said storage memory matrix intersection transistors, and each said means connecting a column of said decoder matrix with a corresponding row of said storage memory matrix includes a complementary conductivity type insulated gate field effect transistor inverter circuit.

3. A memory according to claim 1, wherein said storage memory matrix includes a read input, and complementary conductivity type field effect transistor input circuit for connecting said decoder matrix columns to said storage matrix rows, wherein columns of said storage memory matrix each includes insulated gate field effect transistors having channels connected between a column conductor and a d.c. supply line defining a binary logic level, means connecting gates of selected ones of said column transistors to respective row conductors of said storage memory matrix to define a predetermined read only memory code pattern therein, and the channels of said transistors of a same column of said storage memory matrix being commonly connected to a load transistor for that column.

4. A memory according to claim 3, wherein said input circuit for each row of said storage memory matrix comprises a complementary conductivity type insulated gate field effect transistor transfer gate, one of the transistors of said transfer gate having a gate connected to said read input of said storage memory matrix, and a complementary conductivity type insulated gate field effect transistor inverter circuit connecting said read input to the gate of the other transfer gate transistor and to the gates of said load transistors of each column of said storage memory matrix.

5. A read-only semiconductor memory comprising insulated gate field effect transistors and including a decoder matrix and a storage memory matrix, wherein said decoder matrix and said storage memory matrix each comprises intersecting rows and columns with each intersection defined by a single insulated gate field effect transistor;

said decoder matrix including
  a. an interrogation input,
  b. a plurality of input circuits,
  c. each row of said decoder matrix including n-channel transistors having gates connected by a said input circuit to a respective corresponding address input, each said row transistor forming part of a different column of said decoder matrix and having a channel connected to the channel of the other transistors of said column,
  d. the channels of said transistors of a same column being connected by a common p-channel precharge transistor to a d.c. supply line,
  e. each said input circuit comprising a transfer gate including an n-channel insulated gate field effect transistor and a p-channel insulated gate field effect transistor, said n-channel transistor having a gate connected to an interrogation input, and a complementary conductivity type insulated gate field effect transistor inverter circuit connecting said interrogation input to a gate of said p-channel transistor of said transfer gate, and
  f. a decoder matrix output connected to each individual column thereof;

said storage memory matrix including:
  1. a read input,
  2. a plurality of input circuit means for connecting respective column outputs of said decoder matrix to respective rows of said storage matrix,
  3. each column of said storage memory matrix including a p-channel transistor having a channel connected between a common column conductor and a selected logic level voltage line,
  4. means selectively connecting the gates of said p-channel transistors to row conductors of said storage memory matrix to define a predetermined read-only memory code, and
  5. said p-channel transistors of a same column having their channels commonly connected with an n-channel insulated gate field effect load transistor for that column.

6. A memory according to claim 5, wherein each column output of said decoder matrix includes a complementary conductivity type field effect transistor inverter circuit connecting with a corresponding row conductor of said storage memory matrix.

7. A memory according to claim 5, wherein said input circuit of each row of said storage memory matrix comprises a complementary conductivity type insulated gate field effect transistor transfer gate including an n-channel transistor and a p-channel transistor, said n-channel transistor having a gate connected to said read input of said storage memory matrix; and a complementary conductivity type field effect transistor inverter circuit connecting said read input to a gate of said p-channel transistor of said transfer gate and to the gates of said n-channel load transistors of each column of said storage memory matrix, said transfer gate being connected to a corresponding decoder matrix column output.

* * * * *